(12) United States Patent
Koo et al.

(10) Patent No.: US 9,093,372 B2
(45) Date of Patent: Jul. 28, 2015

(54) TECHNIQUE FOR PROCESSING A SUBSTRATE

(71) Applicant: VARIAN SEMICONDUCTOR EQUIPMENT ASSOCIATES, INC., Gloucester, MA (US)

(72) Inventors: Bon-Woong Koo, Andover, MA (US); Richard M. White, Newmarket, NH (US); Svetlana B. Radovanov, Brookline, MA (US); Kevin M. Daniels, Lynnfield, MA (US); Eric R. Cobb, Danvers, MA (US); David W. Pitman, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 34 days.

(21) Appl. No.: 13/832,715

(22) Filed: Mar. 15, 2013

(65) Prior Publication Data

US 2013/0260543 A1      Oct. 3, 2013

Related U.S. Application Data

(60) Provisional application No. 61/617,904, filed on Mar. 30, 2012.

(51) Int. Cl.
| | |
|---|---|
| *G21K 5/10* | (2006.01) |
| *H01J 37/08* | (2006.01) |
| *H01L 21/265* | (2006.01) |
| *C23C 14/48* | (2006.01) |
| *H01J 37/317* | (2006.01) |

(52) U.S. Cl.
CPC .............. *H01L 21/265* (2013.01); *C23C 14/48* (2013.01); *H01J 37/08* (2013.01); *H01J 37/3171* (2013.01); *H01J 2237/006* (2013.01); *H01J 2237/022* (2013.01); *H01J 2237/0825* (2013.01)

(58) Field of Classification Search
None
See application file for complete search history.

(56) References Cited

U.S. PATENT DOCUMENTS

| | | | |
|---|---|---|---|
| 5,630,880 A * | 5/1997 | Eastlund | ................ 118/723 MP |
| 6,756,600 B2 | 6/2004 | Ng et al. | |
| 7,655,931 B2 * | 2/2010 | Gupta | ..................... 250/492.21 |
| 2008/0179545 A1 | 7/2008 | Perel et al. | |
| 2009/0221136 A1 | 9/2009 | Krueger et al. | |
| 2010/0154835 A1 | 6/2010 | Dimeo et al. | |
| 2010/0155619 A1 | 6/2010 | Koo | |
| 2012/0058252 A1 | 3/2012 | Sweeney et al. | |

OTHER PUBLICATIONS

International Search Report and Written Opinion mailed Jul. 5, 2013 for PCT/US2013/033314 filed Mar. 21, 2013.

* cited by examiner

*Primary Examiner* — Patrick Lewis (57) ABSTRACT

Techniques for processing a substrate are disclosed. In one exemplary embodiment, the technique may be realized with an ion implantation system for processing a substrate. The ion implantation system may comprise: an ion source comprising an ion source chamber, the ion source chamber including an ion source chamber wall that define an ion generation region and an extraction aperture, through which ions generated in the ion generation region are extracted; an extraction system positioned downstream of the ion source near the extraction aperture; a material source comprising a fist source containing first material, a second source containing the second material, and a first and second conduits, where the first conduit may be in communication with the first source and the ion source chamber to provide the first material from the first source to the ion source chamber, and where the second conduit may be in communication with the second source and a first region outside of the ion source chamber to provide the second material from the second source to the first region.

13 Claims, 10 Drawing Sheets

TECHNIQUE FOR PROCESSING A SUBSTRATE

PRIORITY

This Application is a Non-Provisional Application of and claims priority to U.S. Provisional Application Ser. No. 61/617,904, filed on Mar. 30, 2012, and entitled "Techniques For Improving The Performance And Extending The Lifetime Of An Ion Source." The U.S. Provisional Application Ser. No. 61/617,904 is incorporated in its entirety by reference.

RELATED APPLICATION

This Application is also a related Application to co-pending U.S. Non-Provisional application Ser. No. 13/832,578, filed on Mar. 15, 2013, entitled "Technique For Processing a Substrate," and which claims priority to U.S. Provisional Application Ser. No. 61/617,904, filed on Mar. 30, 2012, and entitled "Techniques For Improving The Performance And Extending The Lifetime Of An Ion Source."

FIELD

Present disclosure relates generally to techniques for processing a substrate, more particularly to techniques for processing a substrate using an ion implantation with improved ion source.

BACKGROUND

Ion implantation process is used in manufacturing of, among others, electrical and optical devices. It is used for implanting impurities or dopants to alter one or more properties of a substrate. In integrated circuit (IC) manufacturing, the substrate may be a silicon substrate, and the process may be used alter the electrical property of the substrate. In solar cell manufacturing, the process may be used to alter the optical and/or electrical property of the substrate. As the impurities or dopants implanted into the substrate may affect the performance of the final device, a precise and uniform implant profile is desired.

Figure 1:
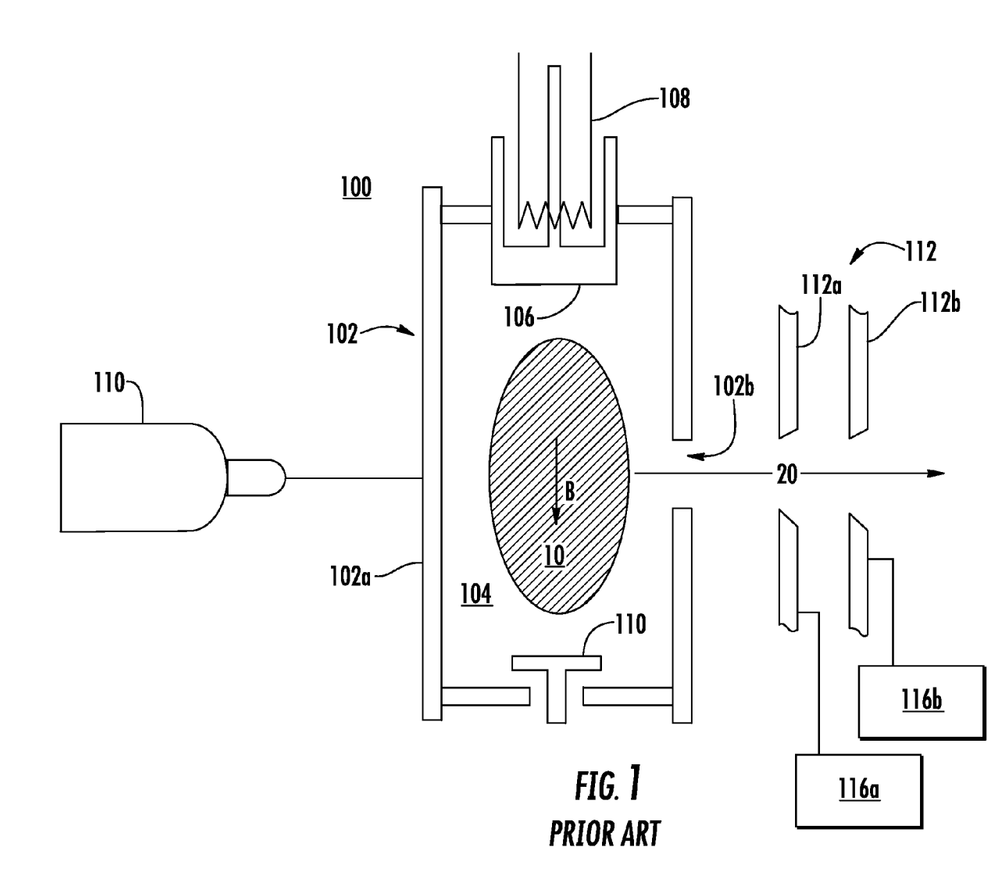
FIG. 1 illustrates a conventional indirectly heated cathode (IHC) ion source.

Referring to FIG. 1, there is shown a conventional indirectly heated cathode (IHC) ion source 100 and an extraction system 112 of a conventional ion implantation system that may be used to implant impurities or dopants. As illustrated in FIG. 1, a typical IHC ion source 100 includes an ion source chamber 102 comprising one or more conductive chamber walls 102a defining an ion generation region 104. The ion source chamber 102 also includes an extraction aperture 102b. At one side of the ion source chamber 102, there may be a cathode 106 and a filament 108. Opposite to the cathode 108, there may be a repeller 110.

A feed source 114 containing feed material may be coupled to the ion source chamber 102. The feed material may contain desired implanter species (e.g. dopant species).

Near the extraction aperture 102b of the ion source chamber 102, there may be an extraction system 112. The extraction system 112 may comprise a suppression electrode 112a positioned in front of the extraction aperture 102b and a ground electrode 112b. The suppression electrode 112a may be electrically coupled to a suppression power supply 116a, whereas the ground electrode 112b may be electrically coupled to an extraction power supply 116a. Each of the suppression electrode 112a and the ground electrode 112b has an aperture aligned with the extraction aperture 102b for extraction of the ions 20 from the ion source chamber 102.

In operation, the feed material is introduced into the ion source chamber 102 from the feed source 110. The filament 108, which may be coupled to a power supply (not shown), is activated. The current supplied to the filament 108 may heat the filament 108 and cause thermionic emission of electrons. The cathode 106, which may be coupled to another power supply (not shown), may be biased at much higher potential. The electrons emitted from the filament 108 are then accelerated toward and heat the cathode 106. The heated cathode 106, in response, may emit electrons toward the ion generation region 104. The chamber walls 102a may also be biased with respect to the cathode 106 so that the electrons are accelerated at a high energy into the ion generation region 104. A source magnet (not shown) may create a magnetic field B inside the ion generation region 104 to confine the energetic electrons, and the repeller 110 at the other end of the ion source chamber 102 may be biased at a same or similar potential as the cathode 106 to repel the energetic electrons.

Within the ion generation region 104, energetic electrons may interact and ionize the feed material to produce plasma 10 containing, among others, ions of desired species 20 (e.g. desired dopants or impurities). The plasma 10 may also contain undesired ions or other fragments of the feed materials.

The extraction power supply 116b may provide an extraction voltage to the ground electrode 112b for extraction of the ion beam 20 from the ion source chamber 102. The extraction voltage may be adjusted according to the desired energy of the ion beam 20. The suppression power supply 116a may bias the suppression electrode 112a to inhibit movement of electrons within the ion beam 20

In order to manufacture devices with optimal performance, it is generally desirable to process the substrate with uniform ion beam with high beam current (i.e. high concentration or dose of desired ions). Moreover, it is desirable to implant the substrate with an ion beam having low beam glitch rate. A glitch is defined as a sudden degradation in the beam quality during an ion implantation operation. If the implantation process is interrupted or affected by a glitch, the substrate may be negatively affected or even potentially rendered unusable. A low beam current may increase the time necessary to achieve proper implant dose in the substrate and lead to lower throughput. Meanwhile, non-uniform beam and/or high glitch rate may result in non-uniform dopant profile. Such deficiencies which are observed often in the ion implantation system with conventional IHC ion sources may lower the throughput and/or increase the manufacturing cost of the devices.

The above deficiencies may be caused by, among others, films or deposits formed on the inner wall of the ion source chamber 102, extraction aperture 102b, and the extraction electrodes 112. As noted above, the plasma 10 generated in the ion generation region 104 contains highly reactive ions and other fragments of the feed material. Such ions and fragments may etch, sputter, or otherwise react with the materials in the ion source chamber 100. The etched materials may then condense to form films or deposits on the ion source chamber wall 102a, the extraction aperture 102b, and the extraction electrodes 112. The films or deposits may block the extraction aperture 102b to cause a non-uniform ion beam 20 having different doses in different regions of the ion beam 20. In addition, the ion beam 20 extracted may have low beam current. In some cases, the films or deposits may be electrically conductive and provide ignition points in which micro/macro arcing may occur. Such arcing may lead to beam glitches.

One way to decrease the rate of such a defective ion beam 20 is to periodically replace the ion source 100 with a new/ clean ion source 100. However, replacement of ion source 100 requires the entire ion source 100 and vacuum pumping system attached to the ion source 100 to be powered down. Moreover, the ion source 102 must be manually replaced. Further, the process by which the ion source 100 may be cleaned is a labor intensive process. Accordingly, frequent replacement of the ion source 100 may lower the efficiency of the ion implantation process.

With increased need for higher ion beam current for manufacturing advanced electronic and solar cell devices, greater amount of feed material is introduced and ionized in the ion source chamber 100. As a result, higher rate of defective beam is observed during ion implantation process. The conventional IHC ion sources may have low performance and low lifetime, and processing substrates in a system containing the conventional IHC ion source may be less than optimal.

In view of the foregoing, it would be desirable to provide a new technique is needed.

SUMMARY

Techniques for processing a substrate are disclosed. In one exemplary embodiment, the technique may be realized with an ion implantation system for processing a substrate. The ion implantation system may comprise: an ion source comprising an ion source chamber, the ion source chamber including an ion source chamber wall that define an ion generation region and an extraction aperture, through which ions generated in the ion generation region are extracted; an extraction system positioned downstream of the ion source near the extraction aperture; a material source comprising a fist source containing first material, a second source containing the second material, and a first and second conduits, where the first conduit may be in communication with the first source and the ion source chamber to provide the first material from the first source to the ion source chamber, and where the second conduit may be in communication with the second source and a first region outside of the ion source chamber to provide the second material from the second source to the first region.

In accordance with other aspects of this particular exemplary embodiment, the first region may be positioned downstream of the ion source, between the ion source and the substrate.

In accordance with further aspects of this particular exemplary embodiment, the first region is proximate to the extraction aperture.

In accordance with other aspects of this particular exemplary embodiment, the extraction system may comprises a suppression electrode and a ground electrode disposed downstream of the suppression electrode.

In accordance with additional aspects of this particular exemplary embodiment, the first region may be positioned between the extraction aperture and the suppression electrode.

In accordance with further aspects of this particular exemplary embodiment, the first region may be positioned between the ground electrode and the suppression electrode.

In accordance with other aspects of this particular exemplary embodiment, the first region may be positioned downstream of the suppression electrode.

In accordance with further aspects of this particular exemplary embodiment, the first material may be B containing material and the second material may be one of P containing material and As containing material.

In accordance with further aspects of this particular exemplary embodiment, the first material may be one of $BF_3$ and $B_2F_4$, and the second material may be one of $PF_3$ and $PH_3$.

In accordance with additional aspects of this particular exemplary embodiment, the first material may be one of P containing material and As containing material, and the second material may be B containing material.

In accordance with further aspects of this particular exemplary embodiment, the first material may be one of $PF_3$ and $PH_3$, and the second material may be one of $BF_3$ and $B_2F_4$.

In accordance with other aspects of this particular exemplary embodiment, the ion implantation system may further comprise one or more beam-line components positioned between the extraction system and the substrate, the one or more beam-line components being configured to mass analyze ions passing therethrough.

In accordance with further aspects of this particular exemplary embodiment, the ion implantation system may further comprise at least one controller configured to control the amount of first material and second material introduced into the ion source chamber and the first region, respectively.

In another exemplary embodiment, the technique may be realized as a method for processing a substrate, the method may comprise: ionizing a feed material in an ion source chamber and generating the ions of the feed material; extracting the ions of the feed material from the ion source chamber through an extraction aperture of the ion source chamber; providing a diluent outside of the ion source chamber near the extraction aperture; and implanting the ions of the feed material into the substrate.

In accordance with other aspects of this particular exemplary embodiment, the implanting the ions of the feed material may comprise implanting the ions of the feed material without implanting ions of the diluent.

In accordance with further aspects of this particular exemplary embodiment, the feed material and the diluent may be chosen from a group consisting of B containing material, P containing material, and As containing material.

In accordance with additional aspects of this particular exemplary embodiment, wherein the feed material is one of $BF_3$ and $B_2F_4$, and wherein the diluent is one of $PH_3$ and $AsH_3$.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION

Herein, several embodiments of improved techniques for processing substrates are disclosed. For clarity and simplicity, the present disclosure may focus on techniques for processing a substrate using an ion implantation system with IHC ion source or RF ion source. However, those of ordinary skill in the art will recognize that the present disclosure may be just as applicable to system with other types of ion sources including Bernas ion source or microwave ion source.

In addition, the present disclosure focuses on the techniques for performing p-type or n-type doping on silicon (Si) substrate. Those of ordinary skill in the art will recognize that the present disclosure is not limited thereto, Referring to FIG. 2, there is shown a simplified block diagram of an ion implantation system 200 according to one embodiment of the present disclosure. The ion implantation system 200 may comprise an ion source 100 for generating ions 30 of desired species. Downstream of the ion source 100, there may be an extraction system 112. A substrate 232, to which the ions 30 may be directed, may be disposed downstream of the extraction system 112. Although not required, the ion implantation system 200 may include one or more of beam-line components 222 which may focus, filter, or otherwise manipulate the ions 30 into an ion beam having desired properties (e.g. desired ion species, beam current, beam energy, implant angle, etc . . . ). Examples of the beam-line components (not shown) may include a mass analyzer magnet, acceleration/deceleration stage (not shown), and a corrector magnet (not shown). The mass analyzer magnet may be configured with a particular magnetic field such that only the ions with a desired mass-to-charge ratio are able to travel through the analyzer. As such, the mass analyzer may be able to separate the ions of desired implant species and undesired species and selective direct the ions of desired implant species toward the substrate 232. The corrector magnet, meanwhile, may be energized to deflect the ion beam in accordance with the strength and direction of the applied magnetic field to provide a beam with desired size and orientation.

Figure 2:
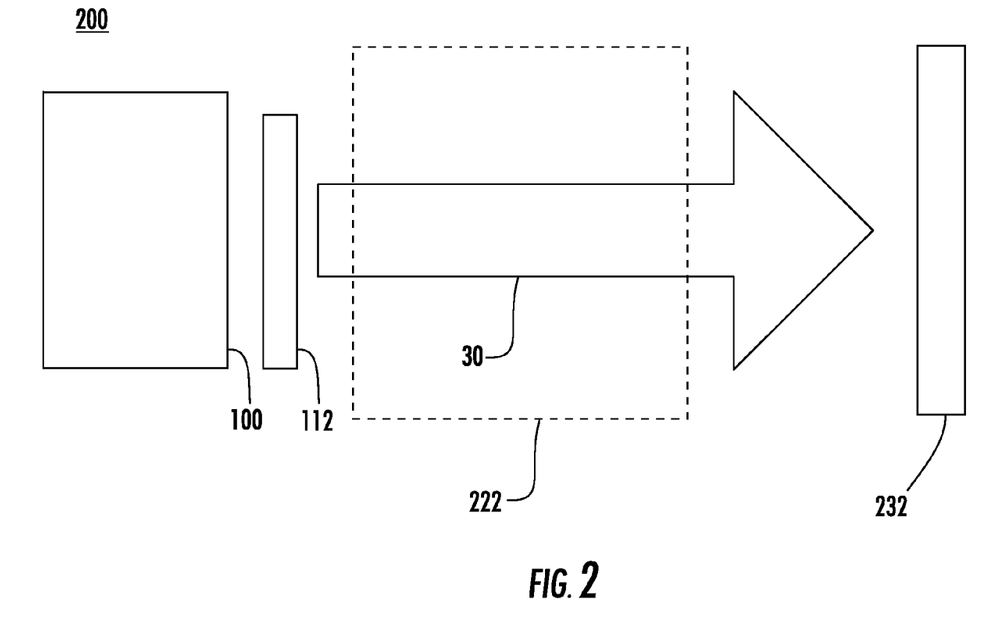
FIG. 2 illustrates an exemplary ion implantation system according to one embodiment of the present disclosure.

The ion implantation system 200 may also include a material source (not shown) coupled to the ion source. As discussed in detail below, the material source may contain feed material and/or diluent. The feed material provided into the ion source 202 from the material source may be converted into, among others, the ions of desired implant species.

Figure 3A:
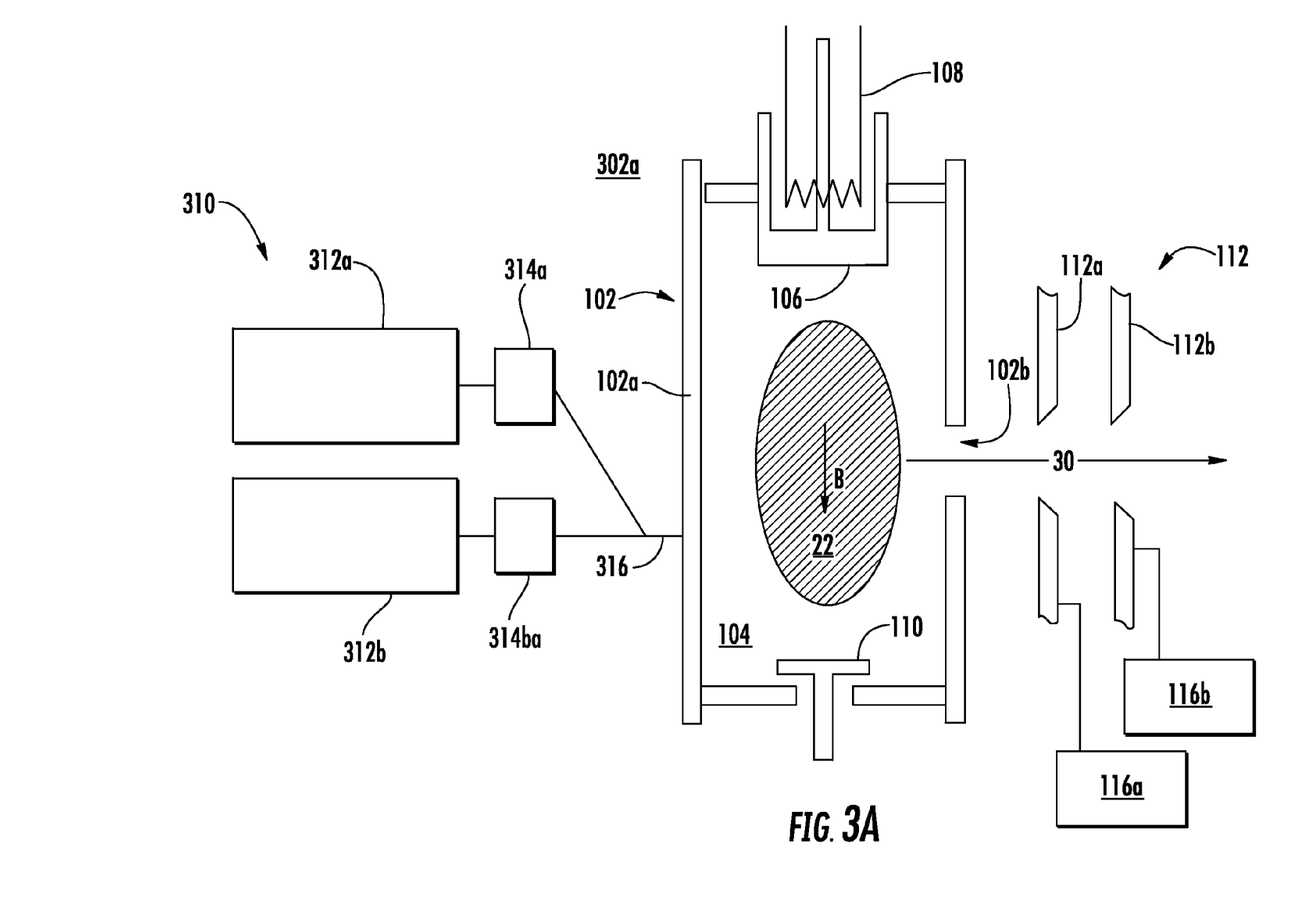
FIG. 3A illustrates an exemplary ion source that may be included in the ion implantation system of FIG. 2 according to one embodiment of the present disclosure.
Figure 3B:
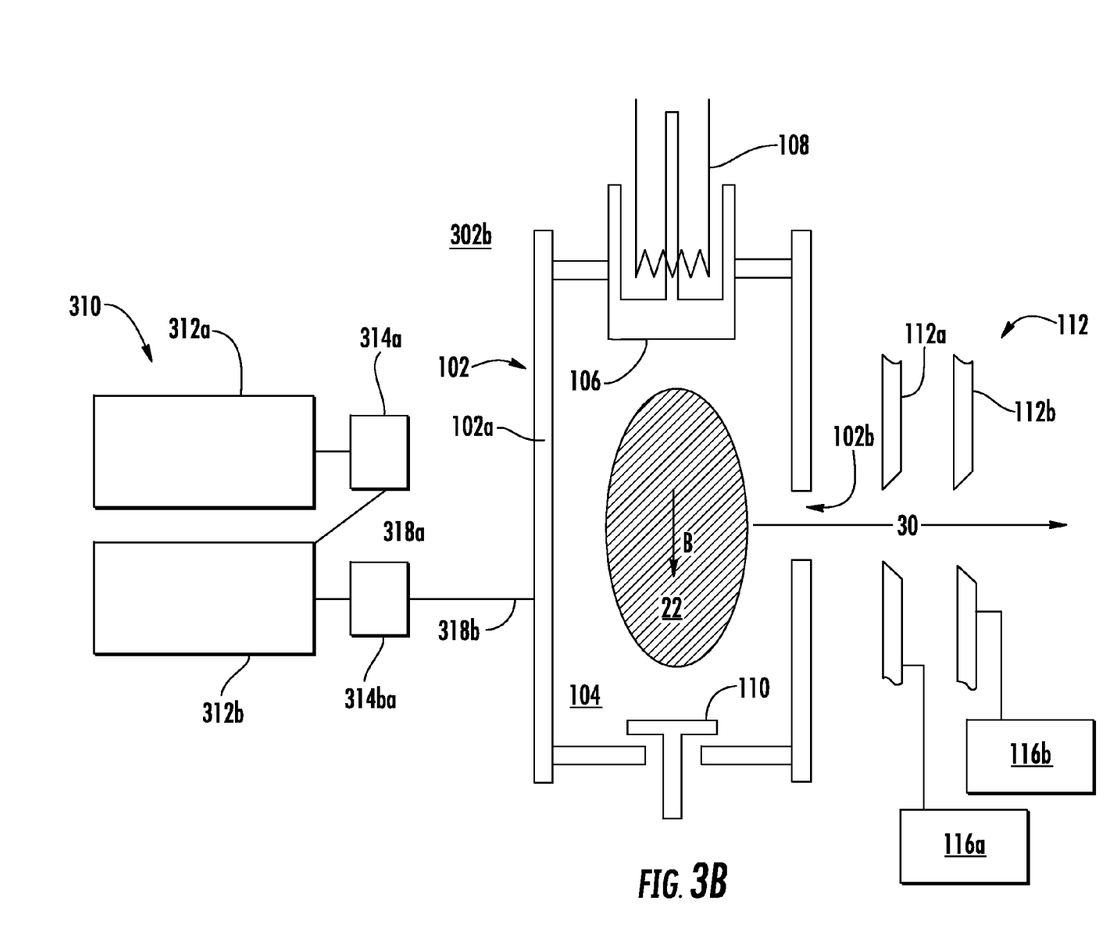
FIG. 3B illustrates another exemplary ion source that may be included in the ion implantation system of FIG. 2 according to another embodiment of the present disclosure.
Figure 3C:
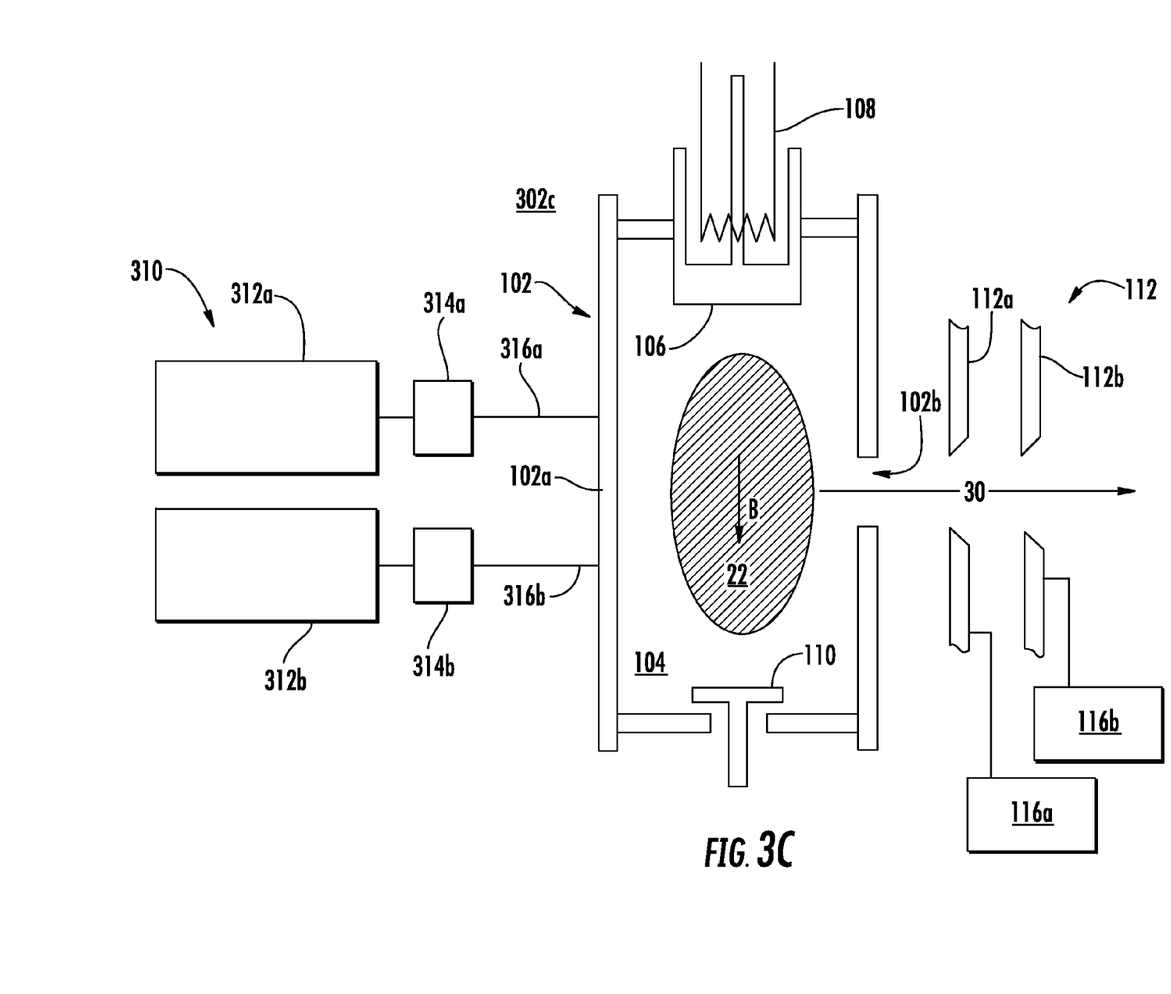
FIG. 3C illustrates another exemplary ion source that may be included in the ion implantation system of FIG. 2 according to another embodiment of the present disclosure.

Referring to FIG. 3A-3C there are shown several exemplary ion sources 302a-302c according to several embodiments of the present disclosure. Each of the ion sources 302a-302c illustrated in FIG. 3A-3C may be the ion source 202 shown in FIG. 2. For clarity and simplicity, the ion sources 302a-302c shown in FIG. 3A-3C incorporate several components in the ion source 100 shown in FIG. 1 and the ion implantation system 200 shown in FIG. 2. As such, the ion sources 302a-302c should be understood in relation to FIGS. 1 and 2. A detailed description of the same components may be omitted.

As illustrated in FIG. 3A-3C, the ion sources 202a-202c may comprise, among others, the ion source chamber 102. The ion source chamber 102 may be coupled to the material source 310. In the present disclosure, the material source 310 may comprise a feed source 312a that provides the feed material into the ion source chamber 102. The material source 310 may also comprise a diluent source 312b that provides diluent into the ion source chamber 102. Although a single feed source 312a and a single diluent source 312b are illustrated in the figure, the present disclosure does not preclude additional feed sources and/or additional diluent sources. Those of ordinary skill in the art will also recognize that the present disclosure does not preclude a scenario where the feed material and the diluent are provided in a single container and provided into the ion source chamber 102 simultaneously.

In the present disclosure, the feed material in the feed source 312a and diluent in the diluents source 312b may preferably be in gaseous or vapor form. However, those of ordinary skill in the art will recognize that some feed material as well as diluent may in solid, liquid, or other form. If in liquid or solid form, a vaporizer (not shown) may be provided near the feed source 312a and/or the diluents source 312b. The vaporizer may convert solid/liquid feed material and/or diluent into gaseous or vapor form and provide the feed material and diluent into the ion source chamber 102 in such a form. To control the amount of feed material and the diluent introduced into the ion source chamber 102, one or more controllers 314a and 314b may be optionally provided.

In one embodiment, as depicted in FIG. 3A, the feed material and the diluent may be contained separately in separate the feed source 312a and the diluent source 312b. The feed material and the diluent may then be pre-mixed in a first conduit 316 and provided into the ion source chamber 102 together. In another embodiment, as depicted in FIG. 3B, the feed material from the feed source 312a may be provided into the diluent source 312b via the first conduit 318a. The feed material and the diluent may be provided into the ion source chamber 102 via the second conduit 318b. Alternatively, the diluent from the diluent source 312b may be provided into the feed source 312a. Yet in another embodiment, a single source containing a mixture of feed material and diluent may be provided, and the feed material and the diluent may be provided into the ion source chamber 102 simultaneously. In one embodiment, as depicted in FIG. 3C, the feed material and the diluent may also be provided into the ion source chamber 102 via separate conduits 316a and 316b.

In the present disclosure, various feed materials may be used. In some embodiments, the feed material may comprise two or more species, at least one of which may be the implant species (or the first feed species) to be implanted into the substrate 232. Depending on the substrates and applications, different implant species may be used. In the present disclosure, the implant species may be the multivalent species found in Group 13-16. Herein, the multivalent species may refer to as species capable of bonding with two or more univalent atoms or ions (e.g. H or halogen species) found in Group 1 or 17 of the Periodic Table to form, in a stable state, a molecule represented by $XY_n$. The symbol X may represent the multivalent species and the symbol Y may represent the univalent species. For p-type doping of silicon (Si) substrate, the implant species in the feed material may be one or more species in Group 13 of the Periodic Table, such as boron (B), aluminum (Al), gallium (Ga), indium (In), and thallium (Tl). For n-type doping of Si substrate, the implant species may be a species in Group 15 and/or 16 in the Periodic Table, such as phosphorous (P), arsenic (As), antimony (Sb), bismuth (Bi), sulfur (S), selenium (Se), and tellurium (Te).

The species in other groups may also be used. For example, the species in Group 14 in the Periodic Table such as carbon (C), Si, germanium (Ge), antimony (Sn), and lead (Pb) may be used as the implant species in implanting, for example, a compound semiconductor substrate, such as gallium nitride (GaN) or gallium arsenide (GaAs) substrate. Meanwhile, species C, Si, Ge, Sn, and Pb, or nitrogen (N) or oxygen (O) implant species may be also used to alter chemical and/or mechanical property of other substrate or target.

In some embodiments, the feed material may contain at least one second feed species which may be different from the implant species. In the example of p-type doping of Si substrate, the second feed species in the feed material may preferably be one of fluorine (F), chlorine (Cl), and hydrogen (H) species. In other embodiments, the second feed species may be some other species. In the present disclosure, the second feed species may be univalent or multivalent species.

Several examples of preferred feed material for p-type doping of Si substrate may include boron trifluoride ($BF_3$), diboron tetrafluoride ($B_2F_4$), borane ($BH_3$), diborane ($B_2H_6$), carborane ($C_2B_{10}H_{12}$), and other materials containing B, and one or both of H and F. In the above examples, B may be the implant species, whereas H and/or F may be the second feed species. For n-type doping of Si substrate, the examples of the preferred feed material may include phosphine ($PH_3$), phosphorous trifluoride ($PF_3$), arsine ($AsH_3$), arsenic trifluoride ($AsF_3$), arsenic pentafluoride ($AsF_5$), and other materials containing one or both of P and As, and one or both of H and F. In such examples, P and/or As may be the implant species, whereas H and/or F may be the second feed species. Other feed material containing other species may also be used for other substrate and/or other applications. Examples of such other feed materials may include silane ($SiH_4$), tetrafluorosilane ($SiF_4$), germane ($GeH_4$), and germanium fluoride ($GeF_4$). Those of ordinary skill in the art will recognize that the above list is not exhaustive. There may be other feed materials that may be used for Si substrate doping applications, other substrate doping applications, and other applications. Moreover, the feed materials listed above for Si substrate doping may also be used for non-Si substrate doping, and vice versa.

The diluent, in the present disclosure, may also include one or more various species. If two or more species are included in the diluent, the first species may be multivalent species found in Group 13-16. In addition, the first diluent species may be different from the first feed species. If included, the second diluent species may also be different from the first feed species. However, the second diluent species may be the same as or different from the second feed species. For example, if the second feed species is H, the second diluent species may be F, or vice versa. In another example, both the second feed species and the second diluent species may be H or F.

Using $BF_3$ as an example of the feed material, the first diluent species of the present disclosure may be at least one of C, N, O, Al, Si, P, S, Ga, Ge, As, Se, In, Sn, Sb, Te, Tl, Pb, and Bi. Although various species may be used, examples of the preferred first diluent species may be N, C, Si, P, and As. Meanwhile, the second feed species may be H and/or F. Several specific examples of such diluent may include methane ($CH_4$), carbon tetrafluoride ($CF_4$), ammonia ($NH_3$), nitrogen trifluoride ($NF_3$), water vapor ($H_2O$), oxygen difluoride ($OF_2$), aluminum hydride ($AlH_3$), aluminum fluoride ($AlF_3$), silane ($SiH_4$), silicon tetrafluoride ($SiF_4$), phosphine ($PH_3$), phosphorous trifluoride ($PF_3$), hydrogen sulfide ($H_2S$), digallen ($Ga_2H_6$), gallium fluoride ($GaF_3$), germane ($GeH_4$), germanium tetrafluoride ($GeF_4$), arsine ($AsH_3$), arsenic trifluoride ($AsF_3$), hydrogen selenide ($H_2Se$), indium hydride ($InH_3$), indium fluoride ($InF_3$), stannane ($SnH_4$), tin fluoride ($SnF_2$), tin tetrafluoride ($SnF_4$), stibine ($SbH_3$), antimony trifluoride ($SbF_3$), hydrogen telluride ($H_2Te$), tellurium tetrafluoride ($TeF_4$), thallene ($TlH_3$), thallium fluoride ($TlF$), plumbane ($PbH_4$), lead tetrafluoride ($PbF_4$), bismuthane ($BiH_3$), and bismuth trifluoride ($BiF_3$). Using $PH_3$ as an example of the feed material, examples of the first diluent species may include B, C, N, O, Al, Si, S, Ga, Ge, As, Se, In, Sn, Sb, Te, Tl, Pb, and Bi, but preferably B, C, and Si. Meanwhile, the second diluent species may be H and/or F. Those of ordinary skill in the art will recognize that the above list is not exhaustive. Other hydride or fluoride of the first diluent species noted above may be just as applicable.

Although the examples provided above include diluent in a compound form, the present disclosure does not preclude diluent in the form of mixture form. For example, the diluent in some embodiments may be a mixture of $N_2$ gas (containing the multivalent species) and $H_2$ gas. The present disclosure also does not preclude the scenario of utilizing diluent that contains multiple multivalent species, such as one or more of B, C, N, O, Al, Si, P, S, Ga, Ge, As, Se, In, Sn, Sb, Te, Tl, PB, and Bi. Those of ordinary skill in the art will recognize that the above examples are not exhaustive. Several of the exemplary diluent may exist in solid form at room temperature. Such diluent may preferably be vaporized in the ion source chamber 102, or vaporized and provided into the ion source chamber 102 in gaseous or vapor form.

Referring back to FIG. 3A-3C, the feed material and the diluent may be introduced, concurrently or sequentially, into the ion source chamber 102. The feed material and diluent may be ionized to form a plasma 22 containing, among others, the ions and other fragments of the feed material and the diluent. The ions 30 of the feed material and the diluent, among others, are then extracted from the ion source chamber 102 by the extraction system 112 through the extraction aperture 102b.

If the ion implantation system is capable of mass analysis (FIG. 2), the desired implant species may be selectively directed to the substrate and implanted. Meanwhile, species other than the implant species may be separated from the implant species and be discarded. In the example of p-type doping of Si substrate using $BF_3$ feed material and $PH_3$ diluent, the ions containing H, B, F, and P may be mass analyzed, and the ions containing B may be separated. Thereafter, the ions containing B may selectively be directed toward the substrate 232. Meanwhile, other ions may preferably be prevented from reaching the substrate 232.

If the ion implantation system is incapable of mass analysis, the ions of the implant species and other species may also be directed and implanted into the substrate 232. In some cases, the implantation of the diluent species may cause loss of effective dose of the implant species. Using $BF_3$ feed material and $PH_3$ diluent in p-type doping of Si substrate may result in the implantation of P, an n-type dopants, along with B. Such a co-implantation p-type dopants and n-type dopants may reduce the effect of the B implant due to compensation. As a result, loss of effective dose of B may be observed.

The loss, however, may be minimal if the amount of diluent provided into the ion source chamber 102 is low (e.g. 5%-20% of the total volume of the feed material and the diluent). In addition, the effect may not be significant if the diluent species chosen has much greater or much smaller mass/diameter. In the above example, implanting P into the substrate may result implant profile that is greater near the surface of the substrate. Meanwhile, B, with much less mass/diameter, may result in implantation at greater depth. Moreover, the activation temperature of P may be lower than that of B. As such, co-implantation of P may have a very small effect on the overall property of the Si substrate. The detrimental effect may be reduced by additional B implant.

To further reduce the effect, it may be desirable to select the second feed species and the first and second diluent species that are inert to the substrate 232. Using $BF_3$ feed material in p-type doping of Si substrate, it may be desirable to use $N_2$, $SiH_4$, $SiF_4$, $GeH_4$, or $GeF_4$ as diluent. The ions of N, Si, and Ge species, even if introduced into the Si substrate, may have minimal effect on the electrical property of the substrate. Meanwhile, H and/or F species implanted into the substrate 232 may be removed from the substrate 232 via diffusion during a post-implantation process (e.g. annealing process).

In the present disclosure, ionizing the diluent noted above with the feed material can result in significant improvement in reducing glitch rates and extending the lifetime of the ion source 202. Without wishing to be bound to a particular theory, it is believed that the ions and other fragments of the second feed species may readily react with the components in the ion source chamber 102 (e.g. the ion source chamber wall 102a, the cathode 106, and the repeller 110) to form a byproduct capable of condensing readily. As a result, films or deposits may form on the ion source chamber wall 102a, the extraction aperture 102b, and the extraction system 112. By introducing ions and other fragments of the diluent species that react readily with those of the second feed species, it is believed that the reaction between the ions and other fragments of the second species with the components in the ion source chamber 102 may be suppressed. Meanwhile, the reaction between the ions and other fragments of the diluent species and the second feed species may result in formation of the byproducts in vapor phase that may be evacuated readily from the ion source chamber 102.

It is also believed that the first diluent species may react with the materials already etched or sputtered from the components within the ion source chamber 102 to form the byproducts in vapor phase. Removing these byproducts may suppress the reaction between the ions and other fragments of the second feed species and the components in the ion source chamber 102 and the formation of materials that can condense to form the films and deposits. With this reduction, micro/macro arcing that leads to the beam glitches may be reduced. Moreover, the lifetime of the ion source 202 in the ion implantation system 100 may be extended.

In several experiments, significant reduction in the glitch rate and increase in the lifetime of the ion source have been observed. Compared to an ion source ionizing only $BF_3$, ionization of $BF_3$ and a small amount of $PH_3$ (e.g. 30% or less of total volume) resulted in reduction of glitch rate by a factor of 20 and increase in the lifetime of the ion source by a factor of 10. A significant reduction in the glitch rate and increase in the lifetime have also been observed after using other diluent described in the present disclosure. Accordingly, use of diluents described above may significantly improve the performance of ion source despite high beam current.

In the present disclosure, the amount of feed material and diluent that may be introduced into the ion source chamber 102 may vary. In one embodiment, the amount of diluent may be about 5%-30%, preferably about 10-15%, of the total volume of the feed material and the diluent. Although present disclosure does not preclude providing additional amount of diluent, additional amount may not be preferable. Excessive amount of the diluent may decrease the ion beam current of the implant species.

Figure 4A:
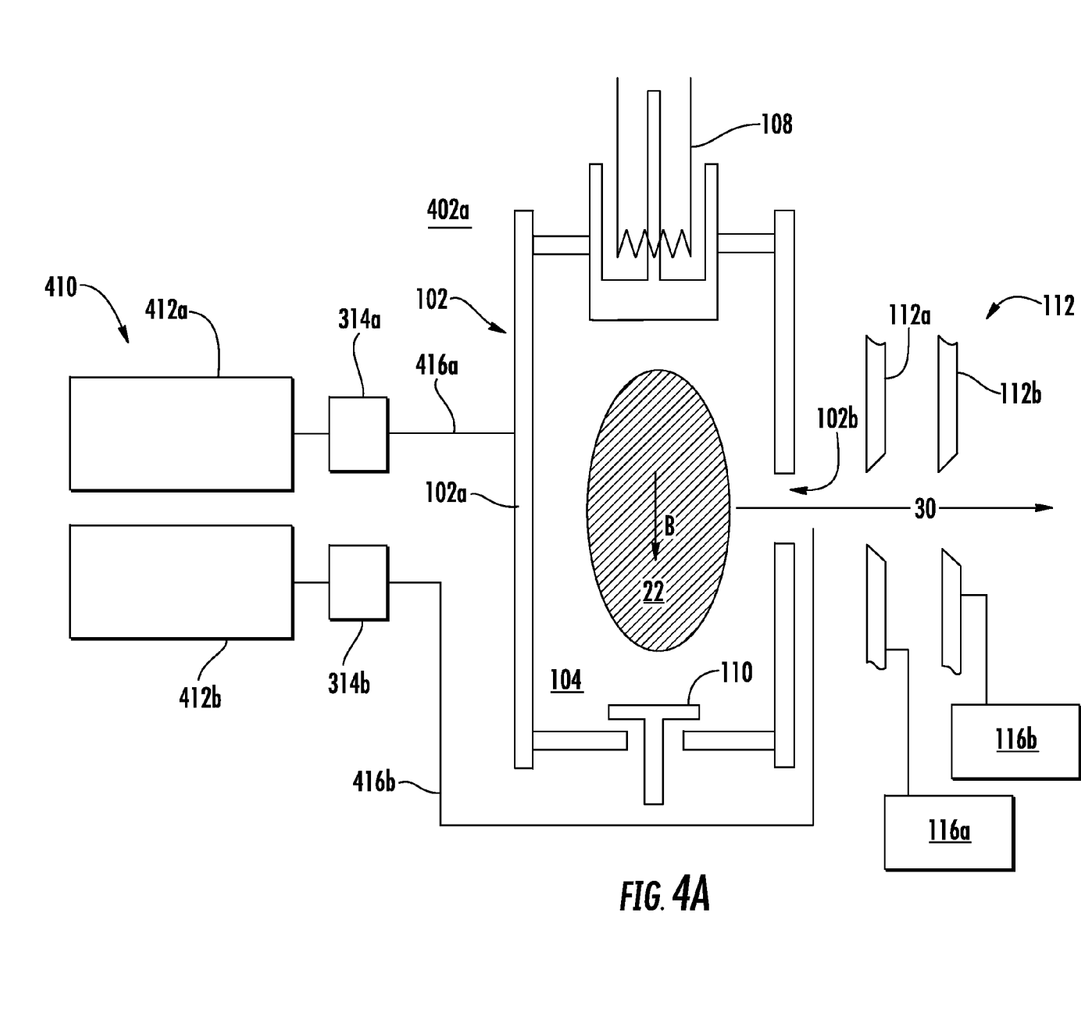
FIG. 4A illustrates another exemplary ion source that may be included in the ion implantation system of FIG. 2 according to another embodiment of the present disclosure.
Figure 4B:
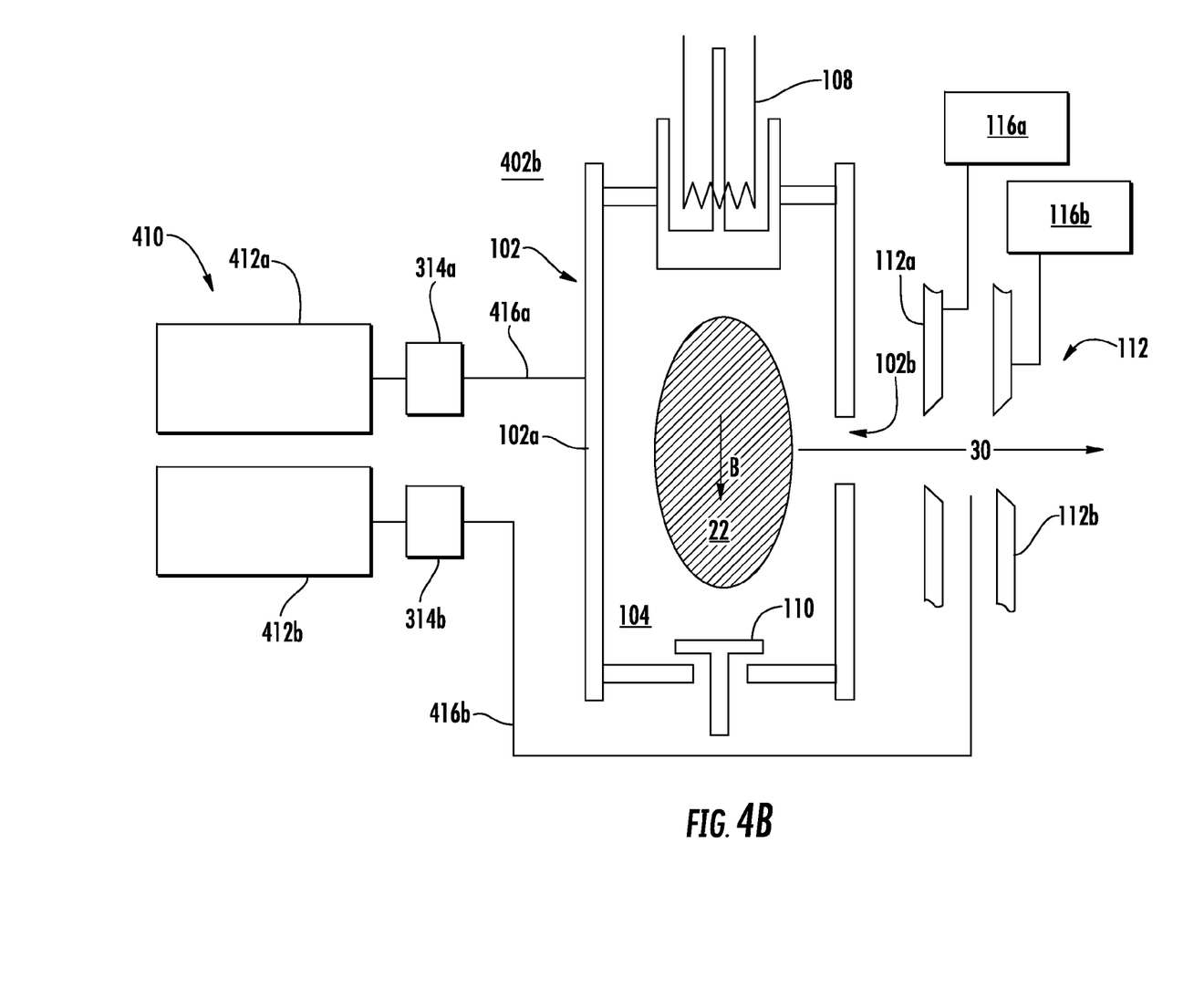
FIG. 4B illustrates another exemplary ion source that may be included in the ion implantation system of FIG. 2 according to another embodiment of the present disclosure.
Figure 4C:
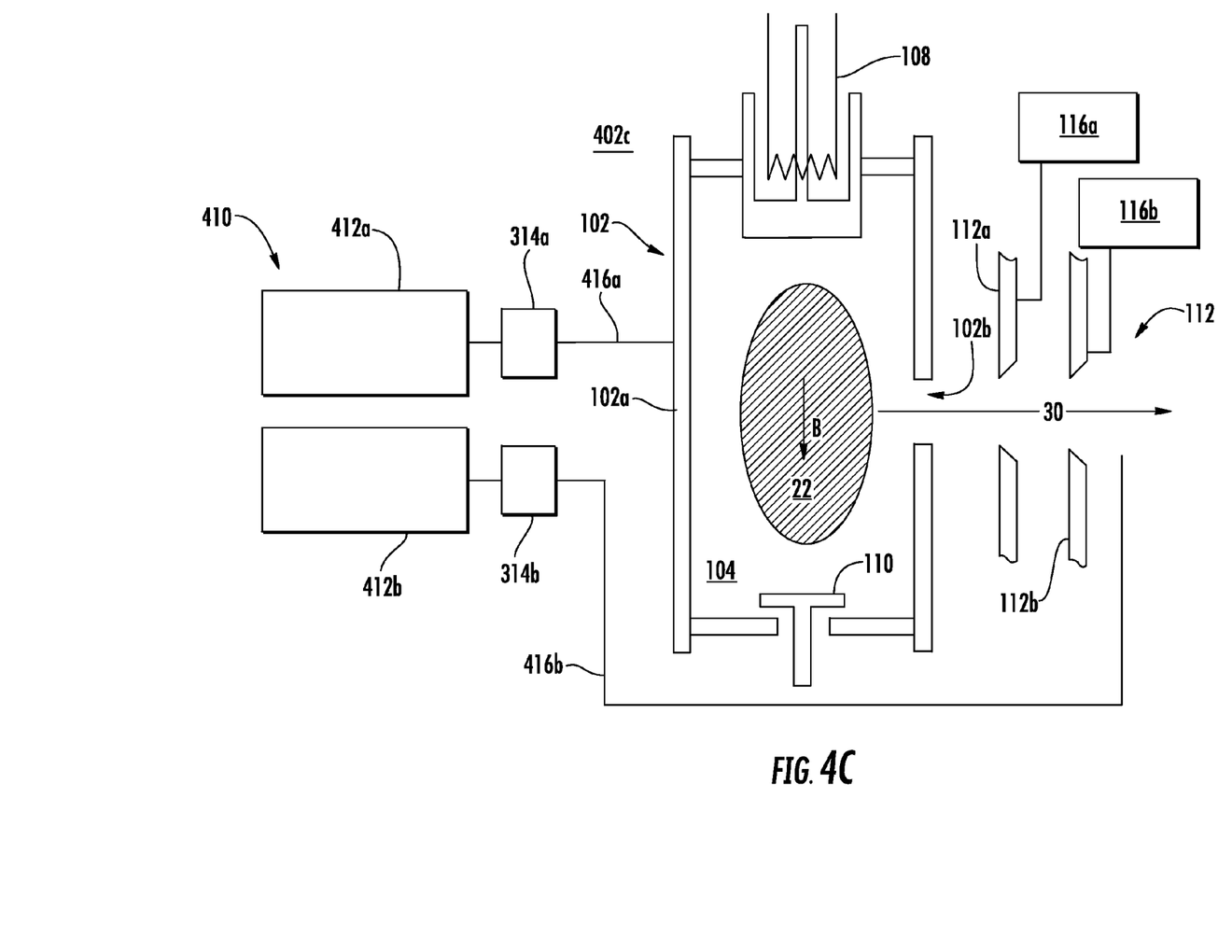
FIG. 4C illustrates another exemplary ion source that may be included in the ion implantation system of FIG. 2 according to another embodiment of the present disclosure.

Referring to FIG. 4A-4C, there are shown several exemplary ion sources 402a-402c according to several embodiments of the present disclosure. Each of the ion sources 402a-402c illustrated in FIG. 4A-4C may be the ion source 202 shown in FIG. 2. For clarity and simplicity, the ion sources 402a-402c shown in FIG. 4A-4C incorporate several components in the ion sources 100 and 302a-302c shown in FIGS. 1 and 3A-3C, and the ion implantation system 200 shown in FIG. 2. As such, the ion sources 402a-402c should be understood in relation to FIGS. 1, 2, and 3A-3C. A detailed description of the same components will not be provided.

As illustrated in FIG. 4A-4C, the ion sources 402a-402c may comprise, among others, the ion source chamber 102. The ion source chamber 102 may be coupled to the material source 410. In the present disclosure, the material source 410 may comprise a feed source 412a that provides the feed material into the ion source chamber 102. The material source 410 may also comprise a diluent source 412b that provides diluent into the ion source chamber 102. Although a single feed source 312a and a single diluent source 312b are illustrated in the figure, the present disclosure does not preclude including additional feed sources and additional diluent sources.

As depicted in FIG. 4A, the feed material and the diluent may be contained separately in separate feed source 412a and the diluent source 412b. The feed material from the feed source 412a may be introduced into the ion source chamber 102 via a first conduit 416a. Unlike the embodiments shown in FIG. 3A-3C, the diluent may be provided outside of the ion source chamber 102 via the second conduit 416b. As shown in FIG. 4A, the diluent may be provided downstream of the ion source chamber 102, between the ion source chamber 102 and the extraction system 112. For example, the diluent may be provided near the extraction aperture 102b, near the aperture of the suppression electrode 112a, or both. In another embodiment, as depicted in FIG. 4B, the diluent may be provided in the extraction system 112 via the second conduit 416b, preferably between the suppression electrode 112a and the ground electrode 112b. In this embodiment, the diluent may be provided near the aperture of the suppression electrode 112a, the aperture of the ground electrode 112b, or both. Yet in another embodiment, as depicted in FIG. 4C, the diluent may be provided downstream of the extraction system 112 via the second conduit 416b, preferably near the aperture of the ground electrode 112b. Although not shown, those of ordinary skill in the art will recognize that the diluent may be directed toward the extraction aperture 102b, the aperture of the suppression electrode 112a and/or the aperture of the ground electrode 112b.

By providing the diluent outside the ion source chamber 102, formation of the ions containing the implant species, taking place within the ion source chamber 102, may be decoupled from the glitch suppression, which may take place outside the ion source chamber 102 and near the extraction electrode 112. By introducing the diluent outside the ion source chamber 102, the ions of the implant species and its density would not likely to be decreased significantly. As such, the current of the implant species may be maximized at given ion source parameters. At the same time, ionization of the diluent may be minimized and the flow of the diluent may suppress formation of film or deposit outside of the extraction aperture and the extraction electrode 12. Thus, the glitching may be reduced.

Reducing the ionization of the diluent may be advantageous in a non-mass analyzed ion implantation system. By reducing ionization of diluent species, implantation of the diluent species, which may otherwise reduce the effective dose of the implant species, may also be reduced.

Figure 5:
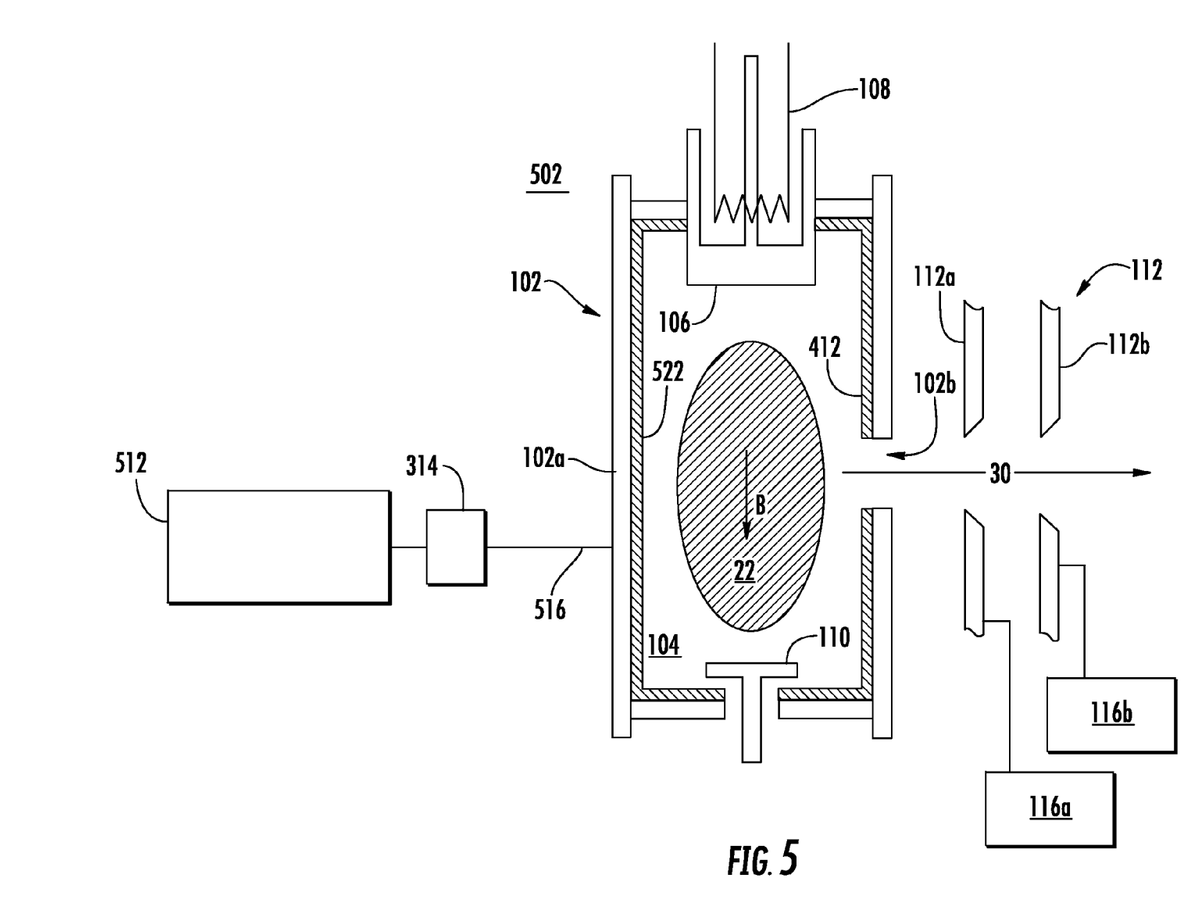
FIG. 5 illustrates another exemplary ion source that may be included in the ion implantation system of FIG. 2 according to another embodiment of the present disclosure.

Referring to FIG. 5, there is shown another exemplary ion source 502 according to another embodiment of the present disclosure. The ion source 502 illustrated in FIG. 5 may be the ion source 202 shown in FIG. 2. For clarity and simplicity, the ion source 502 shown in FIG. 5 incorporates several components in the ion sources 100, 302a-302c, and 402a-402c shown in FIGS. 1, 3A-3C, and 4A-4C, and the ion implantation system 200 shown in FIG. 2. As such, the ion source 502 should be understood in relation to FIGS. 1, 2, 3A-3C, and 4A-4C. A detailed description of the same components will not be provided.

In the present embodiment, the ion source chamber 102 may contain a solid source 522 therein. If the ion source 502 is an IHC or Bernas source, the solid source may be provided in the interior of the ion source chamber wall 102a. If the ion source 502 is an RF plasma/ion source, the solid source 522 may also be provided in the dielectric window facing the ion generation region 104.

The solid source 522, in the present embodiment, may contain one or both of the feed material and the diluent. If only one of the feed material and the diluent is contained in the solid source 522, the other one of the feed material and the diluent may be provided into the ion source chamber 102 from the material source 522.

Figure 6:
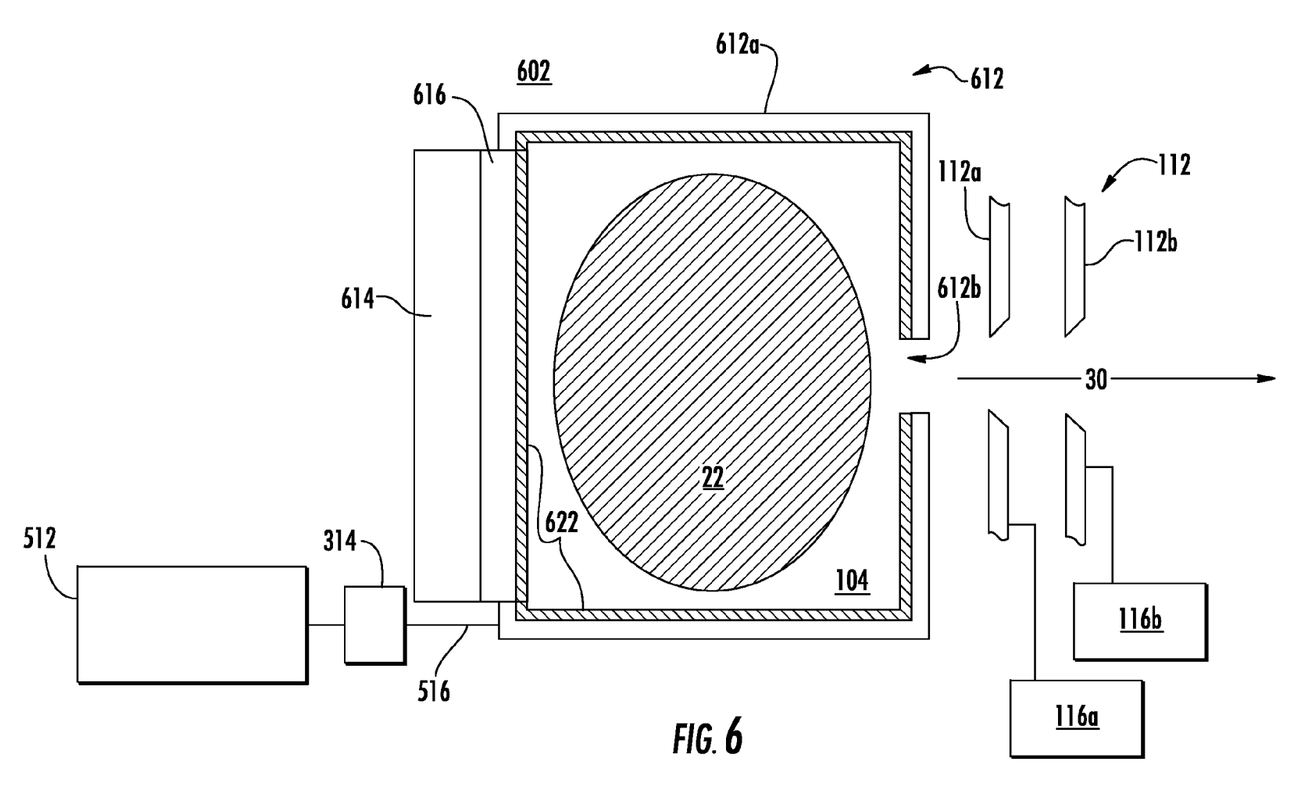
FIG. 6 illustrates another exemplary ion source that may be included in the ion implantation system of FIG. 2 according to another embodiment of the present disclosure.

Referring to FIG. 6, there is shown another exemplary ion source 602 according to another embodiment of the present disclosure. In this figure, an RF plasma/ion source is shown, and this RF plasma/ion source may the ion source 202 shown in FIG. 2. For clarity and simplicity, the ion source 602 shown in FIG. 6 incorporates several components in the ion sources 100, 302a-302c, 402a-402c, and 5 shown in FIGS. 1, 3A-3C, 4A-4C, and 5, and the ion implantation system 200 shown in FIG. 2. As such, the ion source 602 should be understood in relation to FIGS. 1, 2, 3A-3C, 4A-4C, and 5. A detailed description of the same components will not be provided.

As illustrated in FIG. 6, the ion source 602 of the present embodiment may comprise an ion source chamber 612. The ion source chamber 612 may comprise one or more conductive chamber walls 612a and a dielectric window 616 defining an ion generation region 104. The ion source chamber 602 also includes an extraction aperture 612b. The ion source chamber 612 may be coupled to the material source 512. In the present disclosure, the material source 512 may be one of feed source and a diluent source that provides one of the feed material and diluent into the ion source chamber 602. The feed material or the diluent from the material source 512 may be provided by a conduit 516. Unlike the ion source shown in FIG. 1, 2-5, the ion source 602 comprises RF plasma source 614 for generating the plasma 20.

In the present embodiment, a solid source 622 may be provided on the ion source chamber wall 612a and/or the dielectric window 616. The solid source 622, in the present embodiment, may contain one or both of the feed material and the diluent. Meanwhile, the other one of the feed material and the diluent may be provided into the ion source chamber 102 from the material source 512.

Herein, several embodiments of improved techniques for processing substrates are disclosed. It should be appreciated that while embodiments of the present disclosure are directed to introducing one or more diluent gases for improving performance and lifetime of ion sources in beam-line ion implantation systems, other implementations may be provided as well. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes.

What is claimed is:

1. An ion implantation system for processing a substrate, comprising:
    an ion source comprising an ion source chamber, the ion source chamber including an ion source chamber wall that define an ion generation region and an extraction aperture, through which ions generated in the ion generation region are extracted;
    an extraction system positioned downstream of the ion source near the extraction aperture;
    a material source comprising a first source containing first material, a second source containing the second material, and a first and second conduits,
    wherein the first conduit is in communication with the first source and the ion source chamber to provide the first material from the first source to the ion source chamber, and wherein the second conduit is in communication with the second source and a first region outside of the ion source chamber to provide the second material from the second source to the first region.

2. The ion implantation system according to claim 1, wherein the first region is positioned downstream of the ion source, between the ion source and the substrate.

3. The ion implantation system according to claim 2, wherein the first region is proximate to the extraction aperture.

4. The ion implantation system according to claim 1, wherein the extraction system comprises a suppression electrode and a ground electrode disposed downstream of the suppression electrode.

5. The ion implantation system according to claim 4, wherein the first region is positioned between the extraction aperture and the suppression electrode.

6. The ion implantation system according to claim 4, wherein the first region is positioned between the ground electrode and the suppression electrode.

7. The ion implantation system according to claim 4, wherein the first region is positioned downstream of the suppression electrode.

8. The ion implantation system according to claim 1, wherein the first material is B containing material and the second material is one of P containing material and As containing material.

9. The ion implantation system according to claim 8, wherein the first material is one of $BF_3$ and $B_2F_4$, and the second material is one of $PF_3$ and $PH_3$.

10. The ion implantation system according to claim 1, wherein the first material is one of P containing material and As containing material, and wherein the second material is B containing material.

11. The ion implantation system according to claim 10, wherein the first material is one of $PF_3$ and $PH_3$, and wherein the second material is one of $BF_3$ and $B_2F_4$.

12. The ion implantation system according to claim 1, further comprising one or more beam-line components positioned between the extraction system and the substrate, the one or more beam-line components being configured to mass analyze ions passing therethrough.

13. The ion implantation system according to claim 1, further comprising:
   at least one controller configured to control the amount of first material and second material introduced into the ion source chamber and the first region, respectively.

* * * * *